United States Patent
Sun et al.

(10) Patent No.: US 7,524,347 B2
(45) Date of Patent: *Apr. 28, 2009

(54) CMP COMPOSITION COMPRISING SURFACTANT

(75) Inventors: Tao Sun, Naperville, IL (US); Robert Medsker, Yorkville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 342 days.

This patent is subject to a terminal disclaimer.

(21) Appl. No.: 10/975,585

(22) Filed: Oct. 28, 2004

(65) Prior Publication Data

US 2006/0096496 A1 May 11, 2006

(51) Int. Cl.
- C09G 1/02 (2006.01)
- C09G 1/04 (2006.01)
- B24B 1/00 (2006.01)

(52) U.S. Cl. .............. 51/307; 51/308; 51/309; 106/3; 438/691; 438/692; 438/693

(58) Field of Classification Search .......... 51/307–309; 106/3; 438/690–694
See application file for complete search history.

(56) References Cited

U.S. PATENT DOCUMENTS

| | | | |
|---|---|---|---|
| 5,196,353 A | 3/1993 | Sandhu et al. | |
| 5,230,833 A | 7/1993 | Romberger et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,783,489 A | 7/1998 | Kaufman et al. | |
| 5,838,447 A | 11/1998 | Hiyama et al. | |
| 5,858,813 A | 1/1999 | Scherber et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 5,980,775 A | 11/1999 | Grumbine et al. | |
| 5,993,686 A | 11/1999 | Streinz et al. | |
| 6,033,596 A | 3/2000 | Kaufman et al. | |
| 6,039,891 A | 3/2000 | Kaufman et al. | |
| 6,068,787 A | 5/2000 | Grumbine et al. | |
| 6,139,763 A | 10/2000 | Ina et al. | |
| 6,177,026 B1 | 1/2001 | Wang et al. | |
| 6,280,490 B1 | 8/2001 | Rader et al. | |
| 6,300,249 B1 | 10/2001 | Yoshida et al. | |
| 6,313,039 B1 | 11/2001 | Small et al. | |
| 6,376,381 B1 * | 4/2002 | Sabde | 438/693 |
| 6,395,194 B1 | 5/2002 | Russell et al. | |
| 6,428,721 B1 | 8/2002 | Ina et al. | |
| 6,429,133 B1 | 8/2002 | Chopra | |
| 6,435,944 B1 | 8/2002 | Wang et al. | |
| 6,440,186 B1 | 8/2002 | Sakai et al. | |
| 6,454,819 B1 | 9/2002 | Yano et al. | |
| 6,461,227 B1 | 10/2002 | Fang | |
| 6,468,913 B1 | 10/2002 | Pasqualoni et al. | |
| 6,471,735 B1 | 10/2002 | Misra et al. | |
| 6,488,729 B1 | 12/2002 | Ishitobi et al. | |
| 6,541,384 B1 | 4/2003 | Sun et al. | |
| 6,579,923 B2 * | 6/2003 | Yarmey et al. | 524/262 |
| 6,604,987 B1 | 8/2003 | Sun | |
| 6,607,571 B2 | 8/2003 | Ishitobi et al. | |
| 6,630,433 B2 | 10/2003 | Zhang et al. | |
| 6,641,630 B1 * | 11/2003 | Sun | 51/307 |
| 6,645,051 B2 | 11/2003 | Sugiyama et al. | |
| 6,699,402 B2 | 3/2004 | Russell et al. | |
| 6,896,591 B2 * | 5/2005 | Chaneyalew et al. | 451/41 |
| 2001/0049910 A1 | 12/2001 | Kaufman et al. | |
| 2001/0051433 A1 | 12/2001 | Francis et al. | |
| 2002/0168923 A1 * | 11/2002 | Kaufman et al. | 451/36 |
| 2003/0040182 A1 * | 2/2003 | Hsu et al. | 438/692 |
| 2003/0041526 A1 | 3/2003 | Fujii et al. | |
| 2003/0051413 A1 * | 3/2003 | Sakai et al. | 51/307 |
| 2003/0124959 A1 * | 7/2003 | Schroeder et al. | 451/41 |
| 2003/0153184 A1 | 8/2003 | Wang et al. | |
| 2003/0181142 A1 | 9/2003 | De Rege Thesauro | |
| 2003/0228763 A1 | 12/2003 | Schroeder et al. | |
| 2004/0157535 A1 * | 8/2004 | Chaneyalew et al. | 451/41 |
| 2005/0009322 A1 * | 1/2005 | Matsui et al. | 438/633 |

OTHER PUBLICATIONS

Bielmann et al., *Electrochemical and Solid-State Letters*, 2(3), 148-150 (1999).
Katoh et al., *Japanese Journal of Applied Physics*, 42(Part 1, No. 3), 1150-1153 (2003).
Kim et al., *Japanese Journal of Applied Physics*, 39(Part 1, No. 3A), 1085-1090 (2000).
Mullany et al., *Journal of Materials Processing Technology*, 132, 28-34 (2003).
Palla et al., *Twenty Third IEEE/CPMT International Electronics Manufacturing Technology Symposium*, 155-163 (1998).

* cited by examiner

*Primary Examiner*—Michael A Marcheschi
(74) *Attorney, Agent, or Firm*—Thomas E. Omholt; Francia J. Koszyk; Steven D. Weseman

(57) ABSTRACT

The invention provides a polishing composition comprising fumed alumina, alpha alumina, silica, a nonionic surfactant, a metal chelating organic acid, and a liquid carrier. The invention further provides a method of chemically-mechanically polishing a substrate comprising contacting a substrate with a polishing pad and the chemical-mechanical polishing composition, and abrading at least a portion of the substrate to polish the substrate.

26 Claims, No Drawings

CMP COMPOSITION COMPRISING SURFACTANT

FIELD OF THE INVENTION

This invention pertains to a polishing composition and a method for polishing a substrate using the same.

BACKGROUND OF THE INVENTION

The demand for increased storage capacity in memory or rigid disks and the trend towards miniaturization of memory or rigid disks (due to the requirement for smaller hard drives in computer equipment) continues to emphasize the importance of the memory or rigid disk manufacturing process, including the planarization or polishing of such disks for ensuring maximal performance. While there exist several chemical-mechanical polishing (CMP) compositions and methods for use in conjunction with semiconductor device manufacture, few conventional CMP methods or commercially available CMP compositions are well-suited for the planarization or polishing of memory or rigid disks.

As the demand for increased storage capacity has increased, so has the need for improved processes for the polishing of such memory or rigid disks. The term "memory or rigid disk" refers to any magnetic disk, hard disk, rigid disk, or memory disk for retaining information in electromagnetic form. The memory or rigid disk typically has a surface that comprises nickel-phosphorus, but the memory or rigid disk surface can comprise any other suitable material. The planarity of the memory or rigid disks must be improved, as the distance between the recording head of a disk drive and the surface of the memory or rigid disk has decreased. Reduction of defectivity of the memory or rigid disk, that is, the reduction of surface roughness, is necessary to increase recording density. In order to increase recording density, recording density per unit area on the memory or rigid disk must also be increased.

During the polishing of a memory or rigid disk, typically the edges of the disk receive a higher pressure from the polishing tool than the remaining surface area of the disk. Typically, polishing is performed using a combination of an abrasive, a polishing pad, and a liquid carrier, in which the abrasive may be suspended in the liquid carrier, or may be affixed to the surface of the pad. As the polishing process mainly consists of mechanical abrasion of the disk by the abrasive and/or pad, in conjunction with the action of chemicals that may be present, and the rate of abrasion is at least in part a function of pressure applied, the edges of the disk experience a higher rate of abrasion than the rest of the disk. This leads to the formation of a curved, or rounded, contour at the edges of the disk, known in the art as rub-off or dub-off. Such rounded areas on a disk are unsuitable for recording. Thus, if the amount of rub-off can be reduced, the recording capacity for a disk can be increased.

Therefore, considerable effort has been expended in a search for improved processes for the uniform polishing of memory or rigid disks. For example, U.S. Pat. No. 6,488,729 discloses a polishing composition comprising a polishing material, a polishing accelerator, hydroxypropyl cellulose or hydroxyalkyl alkyl cellulose, and water. U.S. Pat. No. 6,645,051 discloses a polishing composition for a memory hard disk comprising a polyoxyethylene polyoxypropylene alkyl ether or a polyoxyethylene polyoxypropylene copolymer, an inorganic or organic acid, an abrasive, and water.

There remains a need, however, for other compositions and methods for planarizing or polishing memory or rigid disks at a high rate, while minimizing surface defectivity. The invention provides such a composition and method. These and other advantages of the invention, as well as additional inventive features, will be apparent from the description of the invention provided herein.

BRIEF SUMMARY OF THE INVENTION

The invention provides a polishing composition comprising (a) fumed alumina, (b) alpha alumina, (c) silica, (d) about 10 to about 1000 ppm of a nonionic surfactant, (e) a metal chelating organic acid, and (f) a liquid carrier. The invention further provides a method of chemically-mechanically polishing a substrate comprising (i) contacting a substrate with a polishing pad and a chemical-mechanical polishing composition comprising (a) fumed alumina, (b) alpha alumina, (c) silica, (d) about 10 to about 1000 ppm of a nonionic surfactant, (e) a metal chelating organic acid, and (f) a liquid carrier, (ii) moving the polishing pad relative to the substrate with the chemical-mechanical polishing composition therebetween, and (iii) abrading at least a portion of the substrate to polish the substrate.

DETAILED DESCRIPTION OF THE INVENTION

The invention provides a polishing composition comprising (a) fumed alumina, (b) alpha alumina, (c) silica, (d) about 10 to about 1000 ppm of a nonionic surfactant, (e) a metal chelating organic acid, and (f) a liquid carrier. The polishing composition desirably allows for reduced edge erosion while allowing for enhanced removal rates in the polishing of metal surfaces such as memory hard disks.

The polishing composition comprises a mixture of fumed alumina, alpha alumina, and silica. Fumed metal oxides, e.g., fumed alumina and fumed silica, can be prepared from any suitable volatile or nonvolatile precursor. Fumed metal oxides can be produced from volatile precursors by hydrolysis and/or oxidation of the precursors (e.g., metal chloride) in a high temperature flame ($H_2$/air or $H_2$/$CH_4$/air) to produce the metal oxide of interest. Fumed metal oxides can be prepared from nonvolatile precursors by dissolving or dispersing the precursor in a suitable solvent such as water, alcohol, or acid-based solvent. The solution containing the precursor can be sprayed into a high temperature flame using a droplet generator, and the metal oxide aggregate then can be collected. Typical droplet generators include bi-fluid atomizers, high pressure spray nozzles, and ultrasonic atomizers.

Fumed alumina is an amorphous form of aluminum oxide, whereas alpha alumina refers to a crystalline polymorph of aluminum oxide formed at high temperatures above 1400° C. Alpha alumina typically refers to alumina comprising about 50 wt. % or more of the alpha polymorph. Fumed alumina is typically less abrasive than alpha alumina. Both forms of alumina are well known in the art and available commercially in a wide range of particle sizes and surface areas.

The silica can be any suitable form of silica. Preferably, the silica is colloidal or fumed silica. Fumed silica refers to a material produced by a process as discussed herein.

Suitable colloidal silica in the context of the invention includes wet-process type silica particles (e.g., condensation-polymerized silica particles). Condensation-polymerized silica particles typically are prepared by condensing $Si(OH)_4$ to form colloidal particles, where colloidal is defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product and the Nalco 1050, 2327, and 2329 products, as well as other similar products available from DuPont, Bayer, Applied Research, Nissan Chemical, and Clariant.

The abrasive particles useful in the invention, i.e., the fumed alumina, alpha alumina, silica, and other such components, desirably have an average particle size of at least about 3 nm or more (e.g., about 3 to about 1000 nm). Preferably, the abrasive particles have an average particle size of about 10 nm or more (e.g., about 10 to about 500 nm, or even about 50 to about 300 nm). Typically, the abrasive particles have an average particle size of about 1000 nm or less (e.g., about 800 nm or less). Preferably, the abrasive particles have an average particle size of about 500 nm or less (e.g., about 300 nm or less).

The polishing composition can comprise a mixture of fumed alumina, alpha alumina, and silica in any suitable ratio. Typically, the polishing composition will contain about 0.01 wt. % or more (e.g., about 0.05 wt. % or more) of fumed alumina, about 0.01 wt. % or more (e.g., about 0.05 wt. % or more) of alpha alumina,, and about 0.01 wt. % or more (e.g., about 0.05 wt. % or more) of silica. Preferably, the polishing composition will contain about 5 wt. % or less (e.g., about 2 wt. % or less) of fumed alumina, about 5 wt. % or less (e.g., about 2 wt. % or less) of alpha alumina, and about 10 wt. % or less (e.g., about 5 wt. % or less) of silica. More preferably, the polishing composition will contain about 0.2 wt. % to about 1 wt. % of fumed alumina, about 0.1 wt. % to about 1 wt. % of alpha alumina, and about 0.1 wt. % to about 4 wt. % of colloidal silica.

The abrasive particles preferably are colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The polishing composition comprises a nonionic surfactant. The purpose of the nonionic surfactant is to reduce the amount of edge polishing observed in the polishing of metal surfaces and to enhance the removal rate of the metal surface. In the polishing of metal surfaces, typically the edges experience higher downforce from a polishing tool. Because abrasion is in part a function of the pressure applied to the surface, the metal edges experience a faster rate of metal erosion relative to the rest of the surface. The result of such uneven polishing of the metal surface results in edge erosion, which is known in the art as rub-off or dub-off. Without wishing to be bound by any particular theory, it is believed that the nonionic surfactant is adsorbed onto the metal surface, thus forming a lubricating film.

A typical disadvantage to the presence of surfactants is reduction of the overall removal rate for the metal surface. The absorption of surfactants onto the metal surface acts to reduce the contact of the abrasive particles with the metal at the surface, and since contact of the abrasive particles with the metal surface is the primary mechanism by which the metal surface is abraded, the removal rate is reduced, often below useful rates, thus limiting the usefulness of surfactants in polishing compositions. However, the presence of a nonionic surfactant in the context of the inventive polishing composition advantageously increases the overall metal removal rate.

Typically, the amount of nonionic surfactant present in the polishing composition will be at least about 10 ppm (e.g., about 10 to about 1000 ppm). Preferably, the amount of nonionic surfactant present in the polishing composition will be about 1000 ppm or less (e.g., about 800 ppm or less, or about 600 ppm or less). If the amount of nonionic surfactant is too low, then no advantage is observed with the addition of the nonionic surfactant. If the amount of nonionic surfactant is excessive, then a reduction in the removal rate of the metal and a deleterious effect on rub-off is observed.

The nonionic surfactant can be any suitable nonionic surfactant. Suitable nonionic surfactants include copolymer surfactants comprising siloxane units, ethylene oxide units, and propylene oxide units. The structure of the aforementioned copolymer surfactants can be linear, pendant, or trisiloxane type. Preferred examples of such copolymer surfactants are commercially available as the Silwet™ family of surfactants, with a pendant structure. The copolymer surfactant comprising siloxane units, ethylene oxide units, and propylene oxide units can have any suitable molecular weight or structure.

Suitable nonionic surfactants also include polymers comprising acrylic esters. Preferred polymers comprising acrylic esters comprise acrylic ester monomers substituted on the alcohol component of the ester monomers with fluorine, e.g., wherein at least one hydrogen atom of the alcohol component is substituted with fluorine. Preferred examples of such polymers comprising acrylic esters are commercially available as Fluorad™ surfactants.

Suitable nonionic surfactants further include linear polymers of ethylene oxide comprising a perfluorinated alkyl chain at one terminus and a hydroxyl group or alkyl group at the other terminus. Preferred examples of such polymers include the Zonyl™ line of surfactants that are commercially available from DuPont.

Suitable nonionic surfactants additionally include copolymers of ethylenediamine with ethylene oxide units and propylene oxide units. Preferred examples of such copolymers include the Tetronic™ family of block copolymer surfactants that are commercially available from BASF.

The polishing composition further comprises a metal chelating organic acid. A metal chelating organic acid is an organic carboxylic acid capable of forming a cyclic compound, e.g., a chelate, with at least one metal ion. Preferred metal chelating organic acids are selected from the group consisting of malonic acid, succinic acid, adipic acid, lactic acid, maleic acid, malic acid, citric acid, glycine, aspartic acid, tartaric acid, gluconic acid, iminodiacetic acid, and fumaric acid, or any carboxylic or amino carboxylic acid.

The polishing composition can comprise any suitable amount of the metal chelating organic acid and typically comprises about 0.0001 wt. % or more of such acid. Preferably, the polishing composition comprises about 0.001 wt. % or more (e.g., about 0.001 wt. % to about 0.5 wt. %) metal chelating organic acid, and more preferably about 0.005 wt. % or more (e.g., about 0.005 wt. % to about 0.25 wt. %) metal chelating organic acid. Typically, the polishing composition comprises about 1 wt. % or less metal chelating organic acid. Preferably, the polishing composition comprises about 0.5 wt. % or less (e.g., about 0.25 wt. % or less) metal chelating organic acid.

It will be appreciated that the aforementioned carboxylic acids can exist in the form of a salt (e.g., a metal salt, an ammonium salt, or the like), an acid, or as a partial salt thereof. For example, tartrates include tartaric acid, as well as mono- and di-salts thereof. Furthermore, carboxylic acids including basic functional groups can exist in the form of an acid salt of the basic functional group. For example, glycines include glycine, as well as acid salts thereof. Furthermore, some compounds can function both as an acid and as a chelating agent (e.g., certain amino acids and the like).

A liquid carrier is used to facilitate the application of the abrasives (particularly the fumed alumina, alpha alumina, and silica), surfactant, metal chelating organic acid, and any optional additives to the surface of a suitable substrate to be polished or planarized. The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The polishing composition can have any suitable pH. Desirably, the polishing composition will have a pH of about 7 or less (e.g., about 6 or less). Preferably, the polishing composition will have a pH of about 1 or more (e.g., about 2 or more). More preferably, the polishing composition will have a pH of about 2 to about 5.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, or a combination thereof. The pH buffering agent can be any suitable buffering agent, for example, phosphates, sulfates, acetates, borates, ammonium salts, and the like. The polishing composition can comprise any suitable amount of a pH adjustor and/or a pH buffering agent, provided that a suitable amount is used to achieve and/or maintain the pH of the polishing composition within the ranges set forth.

The polishing composition can further comprise an oxidizing agent. Preferred oxidizing agents are selected from the group consisting of hydrogen peroxide, urea hydrogen peroxide, peroxysulfuric acid, peroxyacetic acid, perboric acid, salts thereof, and combinations thereof. When an oxidizing agent is present in the polishing composition, the oxidizing agent preferably comprises about 10 wt. % or less (e.g., about 8 wt. % or less, or about 6 wt. % or less) of the composition.

In a preferred embodiment, the polishing composition comprises (a) about 0.2 to about 1 wt. % of fumed alumina, (b) about 0.1 to about 1 wt. % of alpha alumina, (c) about 0.1 to about 4 wt. % of colloidal silica, (d) about 10 to about 1000 ppm of a nonionic surfactant selected from the group consisting of copolymer surfactants comprising silicone units, ethylene oxide units, and propylene oxide units, (e) tartaric acid, and (f) water. In another preferred embodiment, the polishing composition comprises (a) about 0.2 to about 1 wt. % of fumed alumina, (b) about 0.1 to about 1 wt. % of alpha alumina, (c) about 0.1 to about 4 wt. % of colloidal silica, (d) about 10 to about 1000 ppm of a nonionic surfactant selected from the group of copolymers of ethylenediamine with ethylene oxide units and propylene oxide units, (e) tartaric acid, and (f) water.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., acids, bases, etc.) as well as any combination of ingredients (e.g., acids, bases, surfactants, etc.).

For example, the abrasives can be dispersed in a suitable liquid carrier. The nonionic surfactant and metal chelating organic acid can then be added, and mixed by any method that is capable of incorporating the components into the polishing composition. If an oxidizing agent is desired, the oxidizing agent can be added at any time during the preparation of the polishing composition. The polishing composition can be prepared prior to use, with one or more components, such as an optional oxidizing agent, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one package system comprising fumed alumina, alpha alumina, silica, a nonionic surfactant, a metal chelating organic acid, and a liquid carrier. Alternatively, the fumed alumina, alpha alumina, and silica can be supplied as a dispersion in a liquid carrier in a first container, and a nonionic surfactant and a metal chelating organic acid can be supplied in a second container, either in dry form, or as a solution or dispersion in the liquid carrier. Optional components, such as an oxidizing agent, can be placed in the first and/or second containers or a third container. Furthermore, the components in the first or second container can be in dry form while the components in the corresponding container can be in the form of an aqueous dispersion. Moreover, it is suitable for the components in the first or second containers to have different pH values, or alternatively to have substantially similar, or even equal, pH values. If an optional component such as an oxidizing agent is a solid, it may be supplied either in dry form or as a mixture in the liquid carrier. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Other two-container, or three or more container, combinations of the components of the polishing composition are within the knowledge of one of ordinary skill in the art.

The polishing composition of the invention also can be provided as a concentrate which is intended to be diluted with an appropriate amount of liquid carrier prior to use. In such an embodiment, the polishing composition concentrate can comprise the fumed alumina, alpha alumina, silica, a nonionic surfactant, a metal chelating organic acid, and a liquid carrier in amounts such that, upon dilution of the concentrate with an appropriate amount of water, each component of the polishing composition will be present in the polishing composition in an amount within the appropriate range recited above for each component. For example, the fumed alumina, alpha alumina, silica, a nonionic surfactant, and metal chelating organic acid can each be present in the concentration in an amount that is about 2 times (e.g., about 3 times, about 4 times, or about 5 times) greater than the concentration recited above for each component so that, when the concentrate is diluted with an equal volume of liquid carrier (e.g., 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the nonionic surfactant, metal chelating organic acid, and other suitable additives are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the case that more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention further provides a method of chemically-mechanically polishing a substrate comprising (i) contacting a substrate with a polishing pad and the polishing composition comprising described herein, (ii) moving the polishing pad relative to the substrate with the polishing composition therebetween, and (iii) abrading at least a portion of the substrate to polish the substrate.

The substrate to be polished using the method of the invention can be any suitable substrate. A preferred substrate comprises at least one metal layer. Suitable substrates include, but are not limited to, memory or rigid disks, integrated circuits, metals, interlayer dielectric (ILD) devices, semiconductors, micro-electro-mechanical systems, ferroelectrics, and magnetic heads.

The metal layer can comprise any suitable metal. For example, the metal layer can comprise copper, tantalum, titanium, tungsten, aluminum, nickel, nickel-phosphorous, combinations thereof, and alloys thereof. Especially suitable metal substrates comprise aluminum, nickel-phosphorous coated aluminum, or nickel coated aluminum. The substrate can further comprise at least one insulating layer. The insulating layer can be a metal oxide, porous metal oxide, glass, organic polymer, fluorinated organic polymer, or any other suitable high or low-κ insulating layer.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

The polishing method of the invention is equally well suited for use in conjunction with a polishing apparatus designed for polishing memory or rigid disks. Typically, the apparatus comprises a pair of platens (i.e., an upper platen and a lower platen) and a pair of polishing pads (i.e., an upper polishing pad mounted to the upper platen and a lower polishing pad mounted to the lower platen). The upper platen and upper polishing pad have a series of holes or channels formed therein which allow the polishing composition or slurry to pass through the upper platen and upper polishing pad to the surface of the rigid disks being polished. The lower platen further comprises a series of inner and outer gears, which are used to rotate one or more disk carriers. The carriers hold one or more rigid disks so that each major surface (i.e., upper and lower surface) of the rigid disk can contact the upper or lower polishing pad. When in use, the surfaces of the rigid disks are brought into contact with the polishing pads and the polishing composition or slurry, and the upper and lower platens are independently rotated about a common axis. The gears of the lower platen also are driven so that the carriers rotate about an axis or axes within the surface of the upper and lower platens and/or upper and lower polishing pads. The resulting combination of circular motion (due to the rotation of the platens and polishing pads) and orbital motion (due to the rotation of the carriers) evenly polishes the upper and lower surfaces of the rigid disks.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinyl fluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

EXAMPLES

The following examples further illustrate the invention but, of course, should not be construed as in any way limiting its scope.

In each of these examples, similar substrates comprising Ni—P plated aluminum disks were polished with polishing compositions comprising 0.2 wt. % fumed alumina, 0.8 wt. % α-alumina with an average 0.35 μm particle diameter, 3 wt. % colloidal silica, 0.8 wt. % tartaric acid, and 1.2 wt. % hydrogen peroxide in water. The control polishing compositions contained no other ingredients (e.g., no surfactant). The inventive polishing compositions further comprised a nonionic surfactant as set forth in the examples. The polishing experiments generally involved the use of a commercially available polishing apparatus equipped with a polishing pad, and the polishing parameters were the same for all polishing experiments.

Following polishing, the removal rate was determined in Å/min, and the edge polishing parameter was determined using a technique that measures the excess removal of material from the edges as compared with removal of material away from the edges of the test substrates. A lower number indicates a lower degree of edge polishing, e.g., a lower amount of rub-off.

Example 1

This example shows the effect of different copolymer surfactants comprising siloxane units, ethylene oxide units, and propylene oxide units selected from the group of Silwet™ surfactants on removal rate and edge polishing observed with the polishing compositions of the invention. Similar substrates consisting of Ni—P plated aluminum disks were polished with the control polishing composition containing no surfactant and with the inventive polishing compositions containing 200 ppm of the recited surfactant. The results are set forth in Table 1.

TABLE 1

Effect of differing Silwet ™ surfactants on removal rate and edge polishing

| Surfactant | Removal Rate (Å/min) | Edge Polishing |
| --- | --- | --- |
| None (control) | 2612 | 13.8 |
| Silwet ™ L 7622 | 2762 | 14.2 |
| Silwet ™ L77 | 3220 | 12.5 |
| Silwet ™ L7200 | 3460 | 7.4 |
| Silwet ™ L 7602 | 3151 | 12.8 |

As is apparent from the results set forth in Table 1, all but one of the inventive polishing compositions reduced the amount of edge polishing as compared to the control polishing composition. All of the inventive polishing compositions increased the removal rate as compared to the control polishing composition. The use of Silwet™ 7200 notably reduced edge polishing by approximately 46% while increasing the removal rate by approximately 32%. Thus, the results of this example demonstrate the decrease in edge polishing and improvement in removal rate for the inventive polishing compositions comprising nonionic surfactants comprising silicone units, ethylene oxide units, and propylene oxide units on the polishing of Ni—P plated aluminum disks.

Example 2

This example shows the effect of increasing amounts of a surfactant that is a copolymer of ethylenediamine with ethylene oxide units and propylene oxide units, specifically Tetronic™ 904, on edge polishing and removal rate observed with the polishing compositions of the invention. Similar substrates consisting of Ni—P plated aluminum disks were polished with the control polishing composition containing no surfactant and with the inventive polishing compositions containing varying amounts of Tetronic™ 904. The results are set forth in Table 2.

TABLE 2

Effect of increasing levels of Tetronic ™ 904 on removal rate and edge polishing

| Amount of Surfactant (ppm) | Removal Rate (Å/min) | Edge Polishing |
| --- | --- | --- |
| None (control) | 2455 | 14.5 |
| 50 | 2701 | 11.1 |
| 200 | 2897 | 7.3 |
| 400 | 2947 | 8.2 |
| 600 | 3106 | 9.7 |
| 1000 | 3159 | 11.7 |

As is apparent from the results set forth in Table 2, increasing the amount of Tetronic™ 904 from zero to 1000 ppm resulted in an increase in the removal rate to approximately 29% greater than that of the control polishing composition. The decrease in the amount of edge polishing was optimal at 200 ppm and 400 ppm amounts of Tetronic™ 904, with edge polishing approximately 43-50% of control, and a removal rate that increased approximately 20% relative to the control polishing composition. At higher levels of Tetronic™ 904, such as 600 ppm and 1000 ppm, the amount of edge polishing increased somewhat from the 200 ppm and 400 ppm levels, while the removal rates increased as compared to the control polishing composition. Thus, the results of this example demonstrate the improved polishing effect that can be achieved through control of the amount of the nonionic surfactant in the polishing compositions of the invention in the polishing of N—P plated aluminum disks.

Example 3

This example shows the effect of increasing amounts of a copolymer surfactant comprising silicone units, ethylene oxide units, and propylene oxide units, specifically Silwet™ 7200, on edge polishing and removal rate observed with the polishing compositions of the invention. Similar substrates consisting of Ni—P plated aluminum disks were polished with the control polishing composition containing no surfactant and with the inventive polishing compositions containing varying amounts of Silwet™ 7200. The results are set forth in Table 3.

TABLE 3

Effect of increasing levels of Silwet ™ 7200 on removal rate and edge polishing

| Amount of Surfactant (ppm) | Removal Rate (Å/min) | Edge Polishing |
| --- | --- | --- |
| None (control) | 2437 | 13.7 |
| 50 | 2725 | 9.5 |
| 100 | 2697 | 10.4 |
| 200 | 2939 | 7.9 |
| 400 | 2995 | 9.1 |
| 600 | 2502 | 10.7 |
| 1000 | 2543 | 12.6 |

As is apparent from the results set forth in Table 3, increasing the amount of Silwet™ 7200 from zero to 1000 ppm resulted in a decrease in edge polishing, with a maximum decrease of approximately 42% observed at 200 ppm of surfactant, after which the amount of edge polishing increased with increasing surfactant amount to levels approaching that of the control polishing composition. The removal rate correspondingly increased to a maximum of approximately 21% greater than that observed for the control polishing composition using polishing compositions containing 200 ppm and 400 ppm of Silwet™ 7200, with increasing amounts of surfactant exhibiting lower removal rates than observed at optimum amounts of surfactant. Thus, the results of this example demonstrate the effect of the amount of nonionic surfactant in polishing compositions of the invention in the polishing of N—P plated aluminum disks.

Example 4

This example shows the effect of increasing amounts of a copolymer surfactant comprising linear polymers of ethylene oxide comprising a perfluorinated alkyl chain at one terminus and a hydroxyl group at the other terminus, specifically Zonyl™ FSO, on edge polishing and removal rate observed with the polishing compositions of the invention. Similar substrates consisting of Ni—P plated aluminum disks were polished with the control polishing composition containing no surfactant and with the inventive polishing compositions containing varying amounts of Zonyl™ FSO. The results are set forth in Table 4.

TABLE 4

Effect of increasing levels of Zonyl ™ FSO on removal rate and edge polishing

| Amount of Surfactant (ppm) | Removal Rate (Å/min) | Edge Polishing |
| --- | --- | --- |
| None (control) | 2714 | 14.9 |
| 50 | 2570 | 12.4 |
| 100 | 2341 | 11.8 |
| 200 | 2862 | 9.7 |
| 400 | 2604 | 8.2 |
| 600 | 2896 | 7.7 |
| 1000 | 2948 | 8.3 |

As is apparent from the results set forth in Table 4, increasing amounts of Zonyl™ FSO in the polishing compositions resulted in a decrease in edge polishing with a maximum decrease observed at 600 ppm, at which point the amount of edge polishing was approximately 48% lower than that observed with the control polishing composition. The effect of Zonyl™ FSO in the polishing compositions on removal rate was somewhat irregular, but resulted in an approximately 7% increase over the removal rate observed with the control polishing composition at 600 ppm of surfactant. Thus, the results of this example demonstrate the effect of the amount of Zonyl™ FSO in polishing compositions of the invention in the polishing of N—P plated aluminum disks.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A polishing composition comprising:
   (a) about 0.2 to about 1 wt. % of fumed alumina,
   (b) about 0.1 to about 1 wt. % of alpha alumina,
   (c) about 0.1 to about 4 wt. % of silica, wherein the silica is colloidal silica,
   (d) about 10 to about 1000 ppm of a nonionic surfactant,
   (e) a metal chelating organic acid,
   (f) an oxidizing agent selected from the group consisting of hydrogen peroxide, urea hydrogen peroxide, peroxysulfuric acid, peroxyacetic acid, perboric acid, salts thereof, and combinations thereof, and
   (g) a liquid carrier.

2. The polishing composition of claim 1, wherein the nonionic surfactant is selected from the group of copolymer surfactants comprising siloxane units, ethylene oxide units, and propylene oxide units.

3. The polishing composition of claim 1, wherein the nonionic surfactant is selected from the group of acrylic acid containing polymers.

4. The polishing composition of claim 1, wherein the nonionic surfactant is selected from the group of linear polymers of ethylene oxide comprising a perfluorinated alkyl chain at one terminus and a hydroxyl group or alkyl group at the other terminus.

5. The polishing composition of claim 1, wherein the nonionic surfactant is selected from the group of copolymers of ethylenediamine with ethylene oxide units and propylene oxide units.

6. The polishing composition of claim 1, wherein the metal chelating organic acid is selected from the group consisting of malonic acid, succinic acid, adipic acid, lactic acid, maleic acid, malic acid, citric acid, glycine, aspartic acid, tartaric acid, gluconic acid, iminodiacetic acid, and fumaric acid.

7. The polishing composition of claim 1, wherein the liquid carrier comprises water.

8. The polishing composition of claim 7, wherein the pH of the polishing composition is about 1 to about 7.

9. The polishing composition of claim 8, wherein the pH of the polishing composition is about 2 to about 5.

10. The polishing composition of claim 1, wherein the oxidizing agent is hydrogen peroxide.

11. The polishing composition of claim 1 comprising:
    (a) about 0.2 to about 1 wt. % of fumed alumina,
    (b) about 0.1 to about 1 wt. % of alpha alumina,
    (c) about 0.1 to about 4 wt. % of colloidal silica,
    (d) about 10 to about 1000 ppm of a nonionic surfactant, wherein the nonionic surfactant is selected from the group of copolymer surfactants comprising siloxane units, ethylene oxide units, and propylene oxide units,
    (e) a metal chelating organic acid,
    (f) an oxidizing agent selected from the group consisting of hydrogen peroxide, urea hydrogen peroxide, peroxysulfuric acid, peroxyacetic acid, perboric acid, salts thereof, and combinations thereof, and
    (g) a liquid carrier, wherein the liquid carrier is water, wherein the pH of the polishing composition is about 2 to about 5.

12. The polishing composition of claim 1 comprising:
    (a) about 0.2 to about 1 wt. % of fumed alumina,
    (b) about 0.1 to about 1 wt. % of alpha alumina,
    (c) about 0.1 to about 4 wt. % of colloidal silica,
    (d) about 10 to about 1000 ppm of a nonionic surfactant, wherein the nonionic surfactant is selected from the group of copolymers of ethylenediamine with ethylene oxide units and propylene oxide units,
    (e) a metal chelating organic acid, wherein the metal chelating organic acid is tartaric acid,
    (f) hydrogen peroxide, and
    (g) a liquid carrier, wherein the liquid carrier is water, wherein the pH of the polishing composition is about 2 to about 5.

13. A method of chemically-mechanically polishing a substrate comprising:
    (i) contacting a substrate with a polishing pad and a chemical-mechanical polishing composition comprising:
        (a) about 0.2 to about 1 wt. % of fumed alumina,
        (b) about 0.1 to about 1 wt. % of alpha alumina,
        (c) about 0.1 to about 4 wt. % of silica, wherein the silica is colloidal silica,
        (d) about 10 to about 1000 ppm of a nonionic surfactant,
        (e) a metal chelating organic acid,
        (f) an oxidizing agent selected from the group consisting of hydrogen peroxide, urea hydrogen peroxide, peroxysulfuric acid, peroxyacetic acid, perboric acid, salts thereof, and combinations thereof, and
        (g) a liquid carrier,
    (ii) moving the polishing pad relative to the substrate with the chemical-mechanical polishing composition therebetween, and
    (iii) abrading at least a portion of the substrate to polish the substrate.

14. The method of claim 13, wherein the nonionic surfactant is selected from the group of copolymer surfactants comprising siloxane units, ethylene oxide units, and propylene oxide units.

15. The method of claim 13, wherein the nonionic surfactant is selected from the group of terpolymers of acrylic esters.

16. The method of claim 13, wherein the nonionic surfactant is selected from the group of linear polymers of ethylene oxide comprising a perfluorinated alkyl chain at one terminus and a hydroxyl group or alkyl group at the other terminus.

17. The method of claim 13, wherein the nonionic surfactant is selected from the group of copolymers of ethylenediamine with ethylene oxide units and propylene oxide units.

18. The method of claim 13, wherein the metal chelating organic acid is selected from the group consisting of malonic acid, succinic acid, adipic acid, lactic acid, malic acid, citric acid, glycine, aspartic acid, tartaric acid, gluconic acid, iminodiacetic acid, and fumaric acid.

19. The method of claim 13, wherein the liquid carrier comprises water.

20. The method of claim 19, wherein the pH of the polishing composition is about 1 to about 7.

21. The method of claim 20, wherein the pH of the polishing composition is about 2 to about 5.

22. The method of claim 13, wherein the oxidizing agent is hydrogen peroxide.

23. The method of claim 13, wherein the chemical-mechanical polishing composition comprises:
    (a) about 0.2 to about 1 wt. % of fumed alumina,
    (b) about 0.1 to about 1 wt. % of alpha alumina,
    (c) about 0.1 to about 4 wt. % of colloidal silica,
    (d) about 10 to about 1000 ppm of a nonionic surfactant, wherein the nonionic surfactant is selected from the group of copolymer surfactants comprising siloxane units, ethylene oxide units, and propylene oxide units,
    (e) a metal chelating organic acid, wherein the metal chelating organic acid is tartaric acid, (f) an oxidizing agent selected from the group consisting of hydrogen peroxide, urea hydrogen peroxide, peroxysulfuric acid, peroxyacetic acid, perboric acid, salts, thereof, and combinations thereof, and (g) water, wherein the pH of the polishing composition is about 2 to about 5.

24. The method of claim 13, wherein the chemical-mechanical polishing composition comprises:
   (a) about 0.2 to about 1 wt. % of fumed alumina,
   (b) about 0.1 to about 1 wt. % of alpha alumina,
   (c) about 0.1 to about 4 wt. % of colloidal silica,
   (d) about 10 to about 1000 ppm of a nonionic surfactant selected from the group of copolymers of ethylenediamine with ethylene oxide units and propylene oxide units,
   (e) a metal chelating organic acid, wherein the metal chelating organic acid is tartaric acid,
   (f) hydrogen peroxide, and
   (g) a liquid carrier, wherein the liquid carrier is water, wherein the pH of the polishing composition is about 2 to about 5.

25. The method of claim 13, wherein the substrate comprises nickel-phosphorus.

26. The method of claim 13, wherein the substrate is a memory or rigid disc.

\* \* \* \* \*